United States Patent
Hundt et al.

(10) Patent No.: US 6,226,452 B1
(45) Date of Patent: *May 1, 2001

(54) RADIANT CHAMBER FOR SIMULTANEOUS RAPID DIE ATTACH AND LEAD FRAME EMBED FOR CERAMIC PACKAGING

(75) Inventors: Paul Joseph Hundt, Garland; Katherine Gail Heinen, Dallas, both of TX (US); Kwan Yew Kee, Singapore (SG); Ming-Jang Hwang, Richardson, TX (US); Leslie E. Stark; Gonzalo Amador, both of Dallas, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/213,883

(22) Filed: Dec. 17, 1998

Related U.S. Application Data

(62) Division of application No. 08/858,409, filed on May 19, 1997, now abandoned.

(51) Int. Cl.$^7$ ............................ A21B 2/00; C23L 16/00
(52) U.S. Cl. ............................ 392/416; 118/725
(58) Field of Search .................... 392/416, 407; 219/405, 411; 118/725; 437/220

(56) References Cited

U.S. PATENT DOCUMENTS

| | | | |
|---|---|---|---|
| 3,374,531 | 3/1968 | Bruce | 29/498 |
| 3,586,813 | 6/1971 | Cruckshank et al. | 219/85 |
| 3,661,369 | 5/1972 | Costello | 263/2 R |

(List continued on next page.)

FOREIGN PATENT DOCUMENTS

| | | | |
|---|---|---|---|
| 57-152135 | 9/1982 | (JP) | 21/58 |
| 61-32435 | 2/1986 | (JP) | . |
| 63-93119 | 4/1988 | (JP) | 21/52 |
| 64-42136 | 2/1989 | (JP) | 52/12 |

OTHER PUBLICATIONS

IBM Technical Disclosure Bulletin, G. DiGiacomo and G.R. Parker. Prevention of land opens during infrared rework of chips, vol. 20, No. 8, Jan. 1978, pp. 3216–3217.

IBM Technical Disclosure Bulletin, R.F. Lever. Applying radiant heat to semiconductor integrated circuits. vol. 20, No. 10, Mar. 1978, pp. 3908–3909.

IBM Technical Disclosure Bulletin, B.C. Henry and D.A. Jeannotte. Semiconductor structure with integrated infrared energy absorption layer. vol. 22, No. 2, Jul. 1979, PP 681.

IBM Technical Disclosure Bulletin, Infrared brazing. vol. 29, No. 5, Oct. 1986, pp. 2129.

IBM Technical Disclosure Bulletin, J.P. Kirk and C.A. Wasik. Chip motion monitor. vol. 21, No. 10, Mar. 1979, pp. 4041.

Dallas Erickson. Hybrid Package Sealing—Problem Prevention Clinic. Electronic Packaging and Production, Nov. 1982, pp. 133–138.

(List continued on next page.)

*Primary Examiner*—Teresa Walberg
*Assistant Examiner*—Daniel Robinson
(74) *Attorney, Agent, or Firm*—Robby T. Holland; Wade James Brady, III; Frederick J. Telecky, Jr.

(57) ABSTRACT

In integrated semiconductor manufacturing, semiconductor dies may be packaged in ceramic packages. Such packages typically have a base into which the semiconductor die is securedly placed and typically have a lead frame securedly attached to base so that electrical connection may be made to the semiconductor die. A halagen lamp radiant chamber significantly reduces the time it takes to attach the die and lead frame to the ceramic base while reducing particles commonly associated with open belt converyor furnaces.

12 Claims, 4 Drawing Sheets

U.S. PATENT DOCUMENTS

| | | | |
|---|---|---|---|
| 3,718,800 | 2/1973 | Costello | 219/85 |
| 3,836,745 | 9/1974 | Costello | 219/85 |
| 3,879,164 | 4/1975 | Haldopuolos | 432/10 |
| 4,146,655 | 3/1979 | Davis et al. | 427/93 |
| 4,331,253 | 5/1982 | Gordon et al. | 220/200 |
| 4,481,708 | 11/1984 | Bokil et al. | 29/588 |
| 4,517,448 | 5/1985 | Crain et al. | 219/388 |
| 4,636,332 | 1/1987 | Craig et al. | 252/514 |
| 4,674,166 | 6/1987 | Cartwright | 29/240 |
| 4,685,200 | 8/1987 | Bokil | 437/215 |
| 4,722,137 | 2/1988 | Ellenberger | 29/841 |
| 4,837,113 | 6/1989 | Luttmer et al. | 427/38 |
| 4,909,701 | 3/1990 | Hardegan et al. | 414/749 |
| 4,949,671 * | 8/1990 | Davis et al. | 118/725 |
| 5,015,177 | 5/1991 | Iwata | 432/121 |
| 5,046,656 | 9/1991 | Schmitt et al. | 228/123 |
| 5,057,679 | 10/1991 | Audie et al. | 235/492 |
| 5,103,291 | 4/1992 | Lian-Mueller | 357/74 |
| 5,110,388 | 5/1992 | Komiyama et al. | 156/229 |
| 5,183,784 | 2/1993 | Nguyen et al. | 501/19 |
| 5,279,694 | 1/1994 | DiSanto et al. | 156/275.5 |
| 5,296,063 | 3/1994 | Yamamura et al. | 156/64 |
| 5,332,442 * | 7/1994 | Kubodera et al. | 118/725 |
| 5,445,699 * | 8/1995 | Kamikawa et al. | 156/345 |
| 5,673,750 * | 10/1997 | Tsubone et al. | 165/275 |
| 5,772,770 * | 6/1998 | Suda et al. | 118/719 |
| 5,800,686 * | 9/1998 | Littau et al. | 204/298.07 |
| 5,814,365 * | 9/1998 | Mahawili | 427/10 |
| 5,882,419 * | 3/1999 | Sinha et al. | 118/729 |

OTHER PUBLICATIONS

Exair Amplifiers. Convey, vent, exhaust, cooldry, clean—with no moving parts! Exair Corporation, 1250 Century Circle North, Cincinnati, OH 45246. 51–671–3322. Section 6, pp. 27–32.

Infrared Line Heater Model 5193. High–Intensity Infrared Elliptical Reflector Line Heater with 2 Inch (5.08 cm) Focal Point. Research Inc., Box 24064, Minneapolis, MN 55424 612–914–330, pp. 1–4.

* cited by examiner

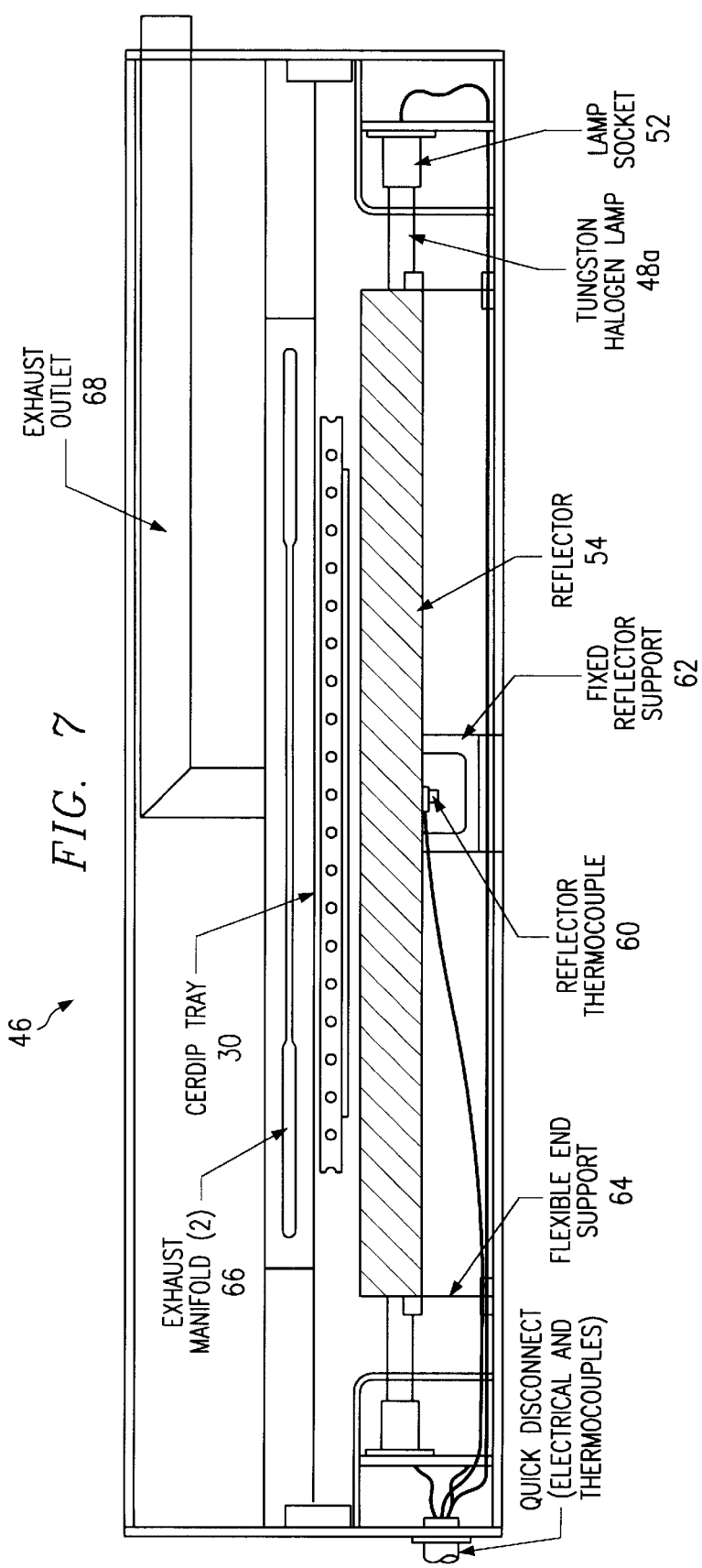

RADIANT CHAMBER FOR SIMULTANEOUS RAPID DIE ATTACH AND LEAD FRAME EMBED FOR CERAMIC PACKAGING

CROSS REFERENCE TO RELATED APPLICATIONS

This application is a division of Ser. No. 08/858,409 filed May 19, 1997, now abandoned.

This application is related to simultaneously cofiled and coassigned application Ser. No. 08/789,516, TI-18553 entitled "Radiant Chamber and Method for Lid Seal in Ceramic Packaging" which is incorporated by reference herein.

This application is related to coassigned Ser. No. 08/255,200, filed on Jun. 7, 1994 entitled "Optical Curing Process for Integrated Circuit Package Assembly" and related to coassigned Ser. No. 08/255,197 entitled "Optical Die Bonding for Semiconductor Devices", both of which are incorporated by reference herein.

FIELD OF THE INVENTION

The invention relates generally to the field of semiconductor manufacturing, more particularly to "back end" assembly, and in particular to furnaces used in ceramic packaging.

BACKGROUND OF THE INVENTION

The manufacturing of packaged integrated semiconductor devices occurs generally in two stages known as "front end" processing and "back end" processing. "Front end" processing deals with formation of various devices such as transistors, resistors, and capacitors on a semiconductor wafer. "Back end" processing deals with assembly and test wherein after formation of the various devices on the semiconductor wafer, the wafer is sliced into semiconductor dies, the dies are assembled into packages, and the packaged dies are tested. Although various packaging techniques exist, the two main techniques are plastic packaging and ceramic packaging.

Ceramic packaging is discussed on pages 455–522 of chapter 7 of *Microelectronics Packaging Handbook* by Rao R. Tummala and Eugene J. Rymaszewski, copyright 1989 and on pages 727–777 of chapter 10. Although different types of ceramic packages exist, most ceramic packages have a lid covering a semiconductor die (chip) mounted to a ceramic base. Prior art FIG. 1 shows a typical ceramic dual in line (CERDIP) packaged device 10. In FIG. 1, a semiconductor die 12 is mounted to a ceramic base 14 by a chip bond material 13. Semiconductor die 12 represents generically many types of semiconductor devices, such as, for example, dynamic random access memories (DRAMs), electrically erasable programmable read only memories (EEPROMs), and microprocessors. Three broad categories of chip die attach bond materials are solders, organic adhesives and glass. Exemplary of solders are Au—Si, Au—Sn, Pb—Ag—In, and Pb—Sn metallic compositions. Exemplary of organic adhesives are epoxies, polyimides (most frequently filled with silver) and thermoplastics such as acrylics, polyester or polyamides filled with metal. Exemplary of glasses are silver-filled glass materials as discussed in "A Critical Review of VLSI Die-Attachment in High Reliability Applications" by Shukla and Mancinger appearing in *Solid State Technology*, July 1985 page 67 et seq. The die attach material must be heated to bond the chip to the ceramic base 14.

Continuing with reference to prior art FIG. 1, packaged device 10 includes wire bonds 16 connecting semiconductor die 12 to a lead frame 18 that is adhered on ceramic base 14 by a seal material 20. Seal material 20 is typically a glass that must be heated to embed lead frame 18. A lid 22 is attached by a seal 24 and covers semiconductor die 12 to seal ceramic package 10. Lid 22 is typically alumina oxide. Seal 24 is typically a glass and must be heated to secure lid 22 to base 14.

Prior art FIG. 2 illustrates an assembly work cell 26 as may exist in a semiconductor manufacturing facility for packaging a ceramic device as illustrated in prior art FIG. 1. Work cell 26 includes a base and lead frame loader station 28. At station 28, ceramic base 14 is placed upon a metal tray holder, illustrated in prior art FIG. 3. Lead frame 18 is then placed on ceramic base 14. Tray 30 of FIG. 3 is made of stainless steel, is about 12 inches long, is about 3 inches wide, and may hold 10 ceramic bases. At die bonder station 32, the die attach material 13 is placed onto base 14 and the die 12 is placed onto base 14. At furnace station 34, the die attach material and seal material are heated to firmly adhere die 12 to base 14 and to embed lead frame 18.

Furnace station 34 of prior art FIG. 2 unfortunately occupies a large amount of expensive manufacturing floor space; it is up to 30 feet long and about 4 feet wide. While multiple trays 30 travel through furnace 34 on a conveyor belt, it unfortunately takes about 1 hour for a tray 30 to pass through furnace 34. Furnace time needs to be reduced to reduce cycle time. Heat is typically provided by electricity passing through metal heater filaments or by gas flames that are disposed over the conveyor furnace belt. The furnace 34 unfortunately has a problem with particle contamination as it is a dirty process. As device geometries continue to shrink (for example, present 16 megabit dynamic random access memories and electrically programmable read only memories are manufactured using 0.5 micron design rules while 256 megabit dynamic random access memories are expected to utilize 0.25 micron design rules), particulates that were formerly acceptable become unacceptable because their size may approximate that of the design rules of the manufactured device. Carbon particulates from furnace 34 may cause about a 10% product loss. Another problem is incomplete lead frame embed; about 2 to 3 thousand packages per million are lost due to incomplete lead frame attach.

After die attach and lead frame embed in prior art FIG. 2, the ceramic bases 14 on trays 30 go to bonder stations 36 where wire bonds 16 are connected to semiconductor die 12 and to lead frame 18. Several bonding stations 36 are typically provided in a work cell. Next, trays 30 go to cap loader station 38. Here, lids 22 with seal material 24 thereon are placed onto bases 14. Thereafter, not shown in prior art FIG. 2, the devices are heated in a conveyor furnace similar to furnace 34 to seal the lids. Prior art FIG. 4, taken from page 752 of *Microelectronics Packaging Handbook*, shows a typical sealing/glazing profile for cerdip ceramic packages.

A proposed lid sealing apparatus and method by Bokil would replace a metal heater filament with a beam of focused infrared light to reduce heat transfer into the ceramic package. See U.S. Pat. Nos. 4,481,708 issued Nov. 13, 1984 and 4,685,200 issued Aug. 11, 1987, and, the article by D. E. Erickson "Hybrid Circuit Sealing-Problem Prevention Clinic", Electronic Packaging and Production, 22(11): pp. 133–137, November 1982. The Bokil system unfortunately appears relatively large and complicated due to the spacing design required to focus the infrared beams towards the glass for the lid seal and the required number of infrared beams (one on each side of the package).

It is thus an object of the invention to provide a new apparatus and method for die attach and lead frame embed on ceramic packages.

Further objects and benefits of the invention will be apparent to those of ordinary skill in the art having the benefit of the description and drawings following herein.

SUMMARY OF THE INVENTION

A rapid cure radiant chamber substantially reduces the time required for die attach and lead frame embed in ceramic packages. The furnace chamber has a lamp assembly for which voltage/time ramp is adjusted for die attach and lead frame embed material. The voltage/time ramp allows for rapid temperature profile within the furnace. The lamp assembly includes a reflector that is disposed below the ceramic packages while an exhaust is disposed above the ceramic packages. Reflection profile is used to optimize the distance from the bottom of the ceramic packages such that the light is unfocused and temperature across the package is uniform. Cerdip trays may be placed into and retrieved from the furnace by a robot arm. Having no open flame and no conveyor belt, the chamber has much less particulates than prior art furnaces while substantially reducing the time for ceramic die attach and lead frame embed to about 5 minutes.

BRIEF DESCRIPTION OF THE DRAWINGS

FIG. 7 is a cross sectional side view of a preferred embodiment of the optical furnace of FIG. 5.

DETAILED DESCRIPTION OF PREFERRED EMBODIMENT

Figure 1:
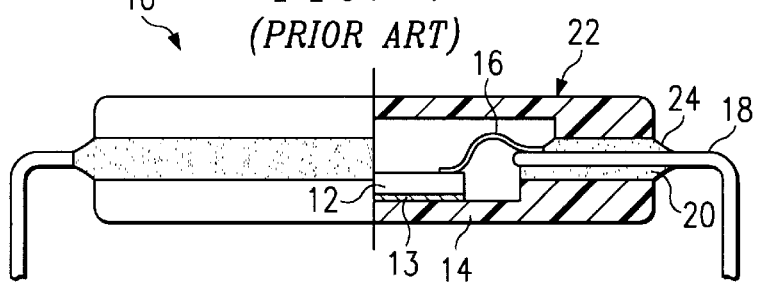
FIG. 1 is a prior art drawing illustrating a lid sealed ceramic packaged device.
Figure 2:
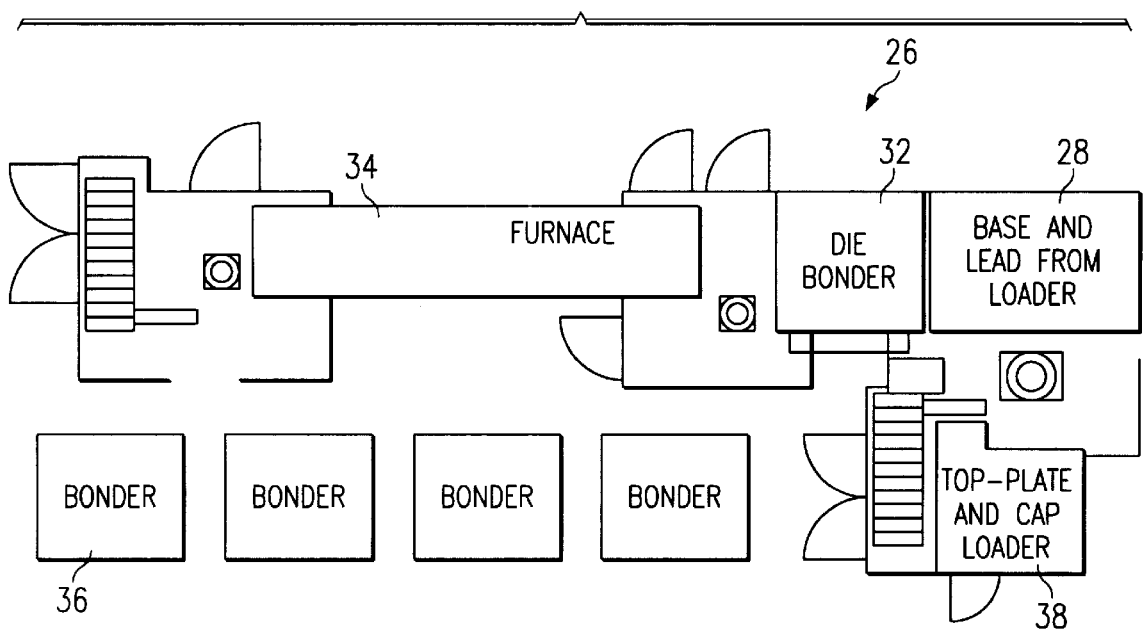
FIG. 2 is a prior art drawing illustrating a ceramic packaging work cell existing in a manufacturing facility.
Figure 3:
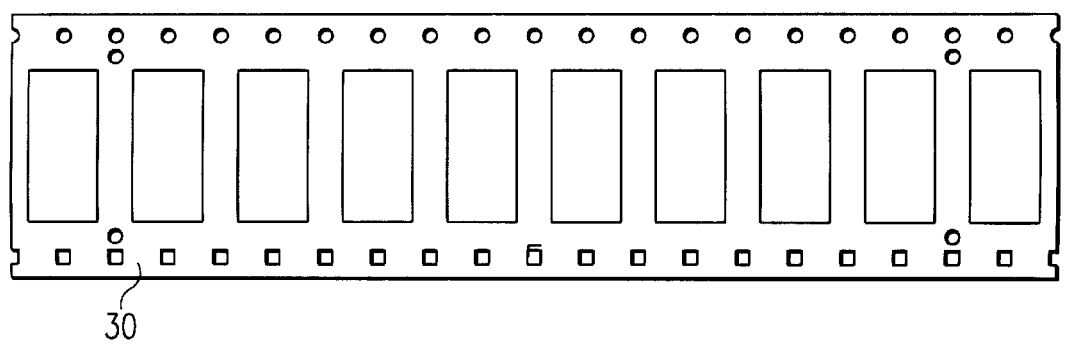
FIG. 3 is a prior art drawing illustrating a ceramic dual in line, CERDIP, tray holder.
Figure 4:
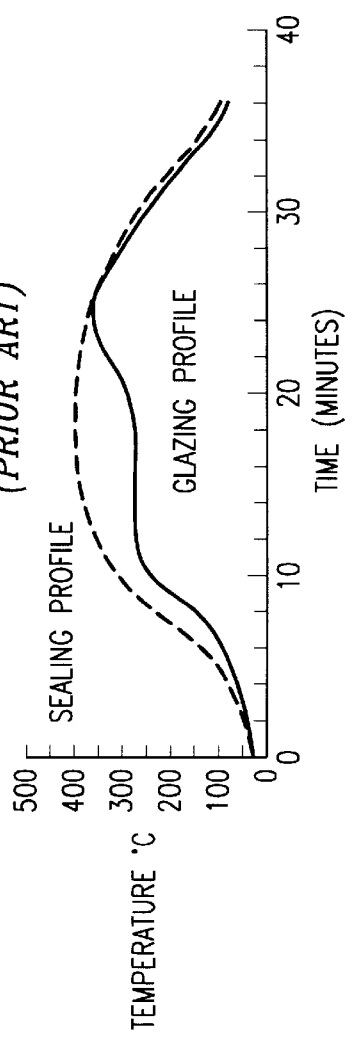
FIG. 4 is a prior art drawing illustrating temperature vs. time profile for conveyor furnace glass sealing.
Figure 5:
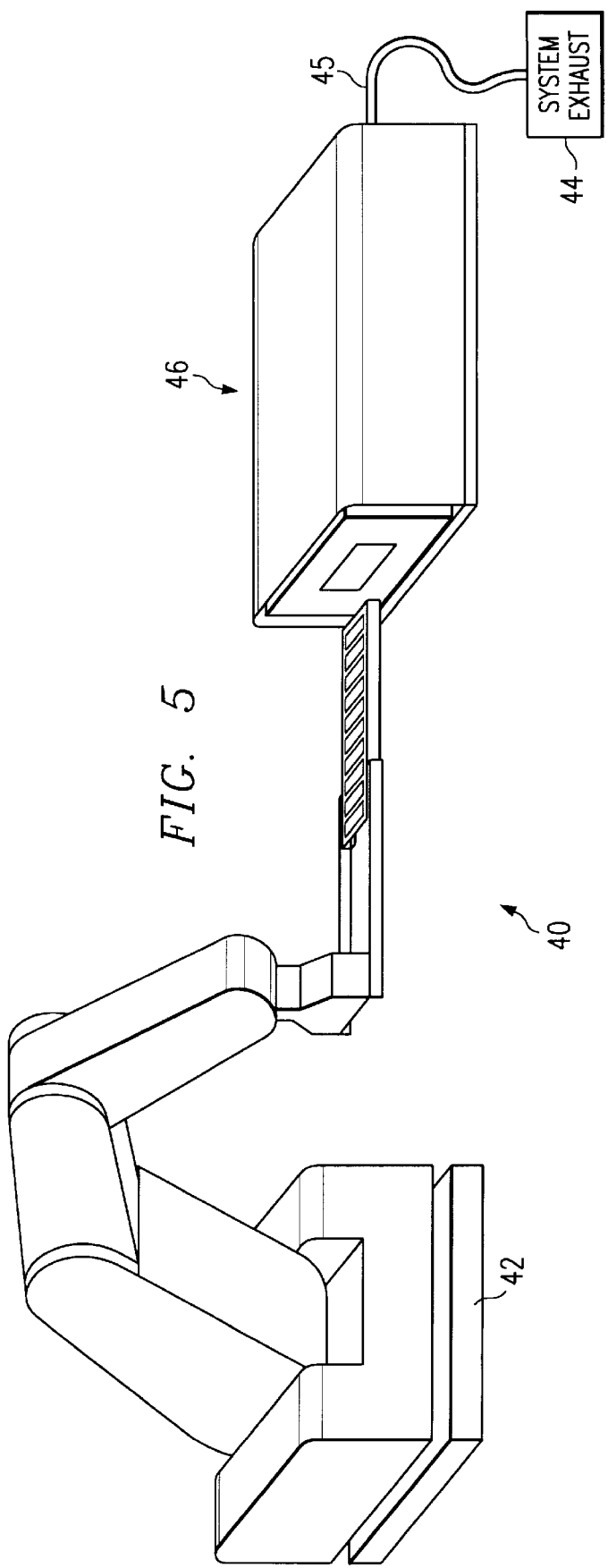
FIG. 5 is drawing illustrating a preferred embodiment of a radiant chamber system for ceramic die attach and lead frame embed.

FIG. 5 is a drawing illustrating a preferred embodiment for a radiant heating system 40 for die attach and lead frame embed in ceramic packages. Radiant heating system 40 advantageously replaces the large conveyor belt furnace 34 of work cell 26 in prior art FIG. 2 as system 40 has a small "footprint" in occupying only about 3 feet by 4 feet of manufacturing floor space while providing simultaneous die attach and lead frame embed in only about 5 minutes while additionally reducing particles.

In FIG. 5, system 40 has a robot arm 42 and an radiant furnace 46. Robot arm 42 is commercially available and one exemplary example is the SRX-4CH-CL manufactured by Sony. Sony's arm is computer controlled and especially constructed for movement in the horizontal plane. Arm 42 places trays 30 holding the ceramic bases into furnace 46 and takes trays 30 out of furnace 46 after the die attach and lead frame embed. One robot arm 42 may serve several furnaces 46 and thus package throughput of furnace system 40 will equal that of a prior art conveyor belt furnace system. A hose 45 connects furnace 46 to an exhaust 44 which represents a typical exhaust vacuum as may exist in a manufacturing facility suitable to provide about 2 inches of water vacuum which is sufficient to provide safe exhaust of outgassing from die attach materials. An alternative suitable independent precision vacuum source is described in copending and coassigned applications bearing Ser. Nos. 08/255,197 and 08/255,200 filed on Jun. 7, 1994 which are incorporated herein by reference.

Figure 6:
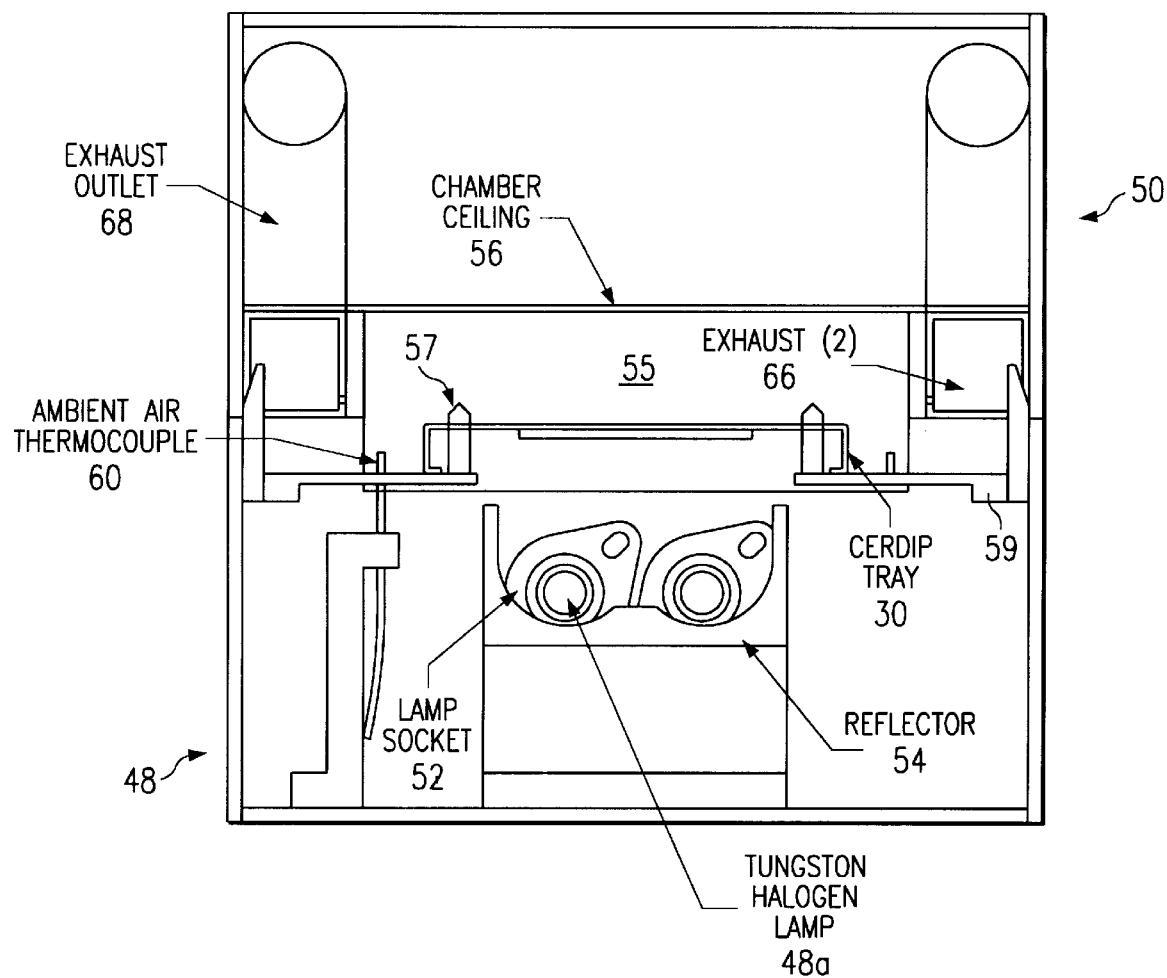
FIG. 6 is an cross sectional end view of a preferred embodiment of the radiant chamber of FIG. 5.

FIG. 6 is a cross sectional end view of a preferred embodiment of radiant furnace 46 while FIG. 7 is a cross sectional side view of furnace 46 that measures only about 2 feet long, about 6 inches high, and about 6 inches wide. Furnace 46 consists of an upper chamber half 50 and a lower chamber half 48. Each half is about 6 inches wide and about 3 inches tall and combine to form a containment box. A heating chamber 55 within containment box 50 is defined by a chamber ceiling member 56 disposed over the top of cerdip tray 30. Tray 30 is held in place within furnace 46 by locator pins 57 that are attached to side rails 59 located between chamber ceiling 56 and lamp assembly tray 48. Locator pins 57 extend through apertures in tray 30 to fix tray 30 in place. Temperature within heating chamber 55 may be monitored through ambient air thermocouple 60 mounted near tray 30.

In FIGS. 6 and 7, radiant heat is provided by lamps preferably of the type that emit near infrared light. Exemplary lamps include incandescent halogen lamps of the tungsten type and xenon type. Such lamps are commercially available and are made by General Electric, Osram-Sylvania, and Ushio. The lower chamber half 48 has two tungsten halogen lamps 48a and 48b. This embodiment uses two 1600 watt tungsten halogen lamps disposed below the tray 30 as the heat source. Such bulbs are manufactured by Ushio and are available in 20 inch lengths at 0.4 inch diameter that utilize 208 volts. The intensity (power) of the lamps may be controlled by a rheostat or SCR (unillustrated for clarity) that may advantageously be computer controlled. This advantageously allows lamp power to be profiled or turned on and off with immediate energy response in contrast to the prior oven furnace system. Instant lamp power adjustment aids in energy profiling that may be desirable in cases where some die bond materials need time to reach final activation temperature in order for volatiles to escape.

In FIGS. 6 and 7, the lamps 48 are mounted with high temperature sockets 52 in a reflector housing 54 having a recess 54a formed therein for placement of lamps 48a and 48b. Aluminum is a suitable metal for reflector housing 54 because of its good reflectivity and high thermal conductivity. Polishing recess 54a provides for better reflection of emissions from lamps 48a and 48b to ceramic bases 14 held in tray 30. It is desirable to position the bulbs within the reflector housing 54 so that temperature across the width of the ceramic bases 14 in cerdip tray 30 is uniform to ensure equal melting of the seal material dispersed over a ceramic base. As opposed to the focused infrared system of Bokil described in the Background of the Invention, furnace system 46 uses unfocused infrared light to heat the ceramic packages. The power of the lamps are adjusted to achieve a uniform temperature across the width of tray 30, and consequently, across the ceramic package. Reflection profile is used to optimize the distance from bottom of the ceramic packages. The reflector 54 has about a 1 inch diameter and a distance of about 1.25 inches from lamp source to ceramic package is sufficient to achieve a uniform temperature across the ceramic package. Providing a darkened surface, such as a hard anodized coating, on the exterior of the reflector enhances cooling of the reflector 54. The reflector 54 is attached to lower half 48 by a fixed support 62 connected near the middle of reflector housing 54 and by flexible end supports 64 to allow for the thermal expansion mismatch between the reflector and the lower chamber half.

In FIGS. 6 and 7, exhaust manifolds 66 are disposed within the heating chamber 55 above side rails 59. The exhaust manifolds 66 are coupled to exhaust outlets 68 located above chamber ceiling 56. The exhaust manifolds 66 are connected together and further connected to hose 45 that connects furnace 46 to system exhaust 44. The manifolds have a slot cut into their sides which allows for removal of particles as well a mechanism for removing any contamination from die attach outgassing.

In performing die attach and lead frame embed using furnace 40, using a quick cure silver glass such as manufactured by companies such as Johnson Mathey Incorporated or Quantum Materials Incorporated which sets up at about 400° C. substantially speeds up the process. Trays having lead frames attached to ceramic bases with conventional glass and dies attached to ceramic bases with such quick cure glass are inserted into furnace 46 which may have previously had voltage applied to lamps 48 for a time sufficient to provide a consistent initial heated chamber temperature. A two step voltage/time ramp up is then utilized to activate the die attach and lead frame embed materials. Using a slow temperature profile tailored for the die attach material, low voltage is applied to the lamps and temperature within chamber 55 is ramped up to a temperature near the solvent boiling point for about 2 minutes. This allows solvents within the die attach material to evaporate without boiling the material. Thereafter, voltage on the lamps is substantially increased to raise the temperature within chamber 55 to about 470° to 480° C. in about 3 minutes to activate the die attach material and lead frame seal material. Voltage on the lamps is then reduced to allow the chamber temperature to decrease below about 120° C. Tray 30 is removed and the next tray 30 is then inserted into furnace 46. The entire process takes approximately 5 minutes which is a substantial time savings over the prior art conveyor belt furnace. Using a bank of about 14 radiant chamber furnaces with about a 5 minute cycle time will equal about 1500 devices per hour which is about equal to the number of devices passing through a conveyor belt furnace with about an hour cycle time. With no moving belt and no open flames, particulates are drastically reduced.

For ceramic lid seal, the configuration of furnace 40 changes such that lamp and reflector is disposed above the ceramic packages in cerdip tray 30. While the exhaust manifolds are preferably located below cerdip tray 30, they may, however, be located above if sufficient spacing is available. The distance between the reflector and ceramic packages will be such that the light across the lid and package is unfocused and the temperature across the lid and package is uniform. The entire glass lid seal process takes less than about 5 minutes for temperature ramp up and cool down which is a substantial time savings over prior art oven techniques and with a much simpler system than the focused infrared system of prior art Bokil.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method for performing simultaneous die attach and lead frame embed in a ceramic package, comprising the steps of:

providing a ceramic base having an upper surface;

disposing a lead frame on said upper surface and a first seal material on or under a portion of said lead frame which is disposed over said upper surface;

depositing a die attach material on said upper surface spaced from said lead frame and disposing a semiconductor die over said die attach material;

heating said first seal material and said die attach material on said upper surface simultaneously to cause said die attach material to adhere said semiconductor die to said surface and to embed said lead frame in said first seal material;

then disposing a second seal material over said surface including said lead frame;

disposing a ceramic lid over said second seal material; and heating said second seal material to adhere said lid to said lead frame and said ceramic base over said upper surface.

2. The method of claim 1 further including the step of providing a chamber and performing said steps of heating within said chamber.

3. The method of claim 2 further including the step of providing an infrared lamp within said chamber to provide heat for said step of heating.

4. The method of claim 3 further including the step of providing a thermocouple within said chamber and controlling said infrared lamp in response to a signal from said thermocouple.

5. The method of claim 3 wherein said infrared lamp in disposed in said chamber beneath said ceramic base and remote from said lid.

6. The method of claim 4 wherein said infrared lamp in disposed in said chamber beneath said ceramic base and remote from said lid.

7. The method of claim 1 wherein said semiconductor die is a partially fabricated and tested device.

8. The method of claim 2 wherein said semiconductor die is a partially fabricated and tested device.

9. The method of claim 3 wherein said semiconductor die is a partially fabricated and tested device.

10. The method of claim 4 wherein said semiconductor die is a partially fabricated and tested device.

11. The method of claim 5 wherein said semiconductor die is a partially fabricated and tested device.

12. The method of claim 8 wherein said semiconductor die is a partially fabricated and tested device.

* * * * *